United States Patent [19]
Novak

[11] 3,955,163
[45] May 4, 1976

[54] METHOD OF POSITIONING A SEMICONDUCTOR WAFER FOR CONTACT PRINTING

[75] Inventor: Walter Thomas Novak, San Jose, Calif.

[73] Assignee: The Computervision Corporation, Bedford, Mass.

[22] Filed: June 24, 1974

[21] Appl. No.: 482,202

[52] U.S. Cl. .............................. 355/132; 29/569 R; 29/578; 269/21; 279/3; 355/91
[51] Int. Cl.² .................. G03B 27/02; G03B 27/20
[58] Field of Search ............... 355/87, 91, 92, 132; 279/3; 269/21; 29/569, 578

[56] References Cited
UNITED STATES PATENTS
3,510,217  5/1970  Cirimele .......................... 355/92 X

*Primary Examiner*—John Gonzales
*Attorney, Agent, or Firm*—Richard J. Birch

[57] ABSTRACT

A non-planar semiconductor wafer chuck having a plurality of outwardly extending channels in the chuck face and a plurality of vacuum/pressure ports extending through the chuck and communicating with the face thereof. When a semiconductor wafer is positioned with respect to an overlying photomask by the chuck, atmospheric pressure is applied to the centrally located port or ports and a vacuum is applied to the peripheral ports of the chuck. The resulting pressure differentials acting in concert with a surrounding vacuum chamber causes the central portion of the wafer to rise against the photomask while the peripheral portions of the wafer are drawn down into the channels. At this point in the operational sequence, the normally trapped nitrogen can escape through breaks in the peripheral seal between the mask and wafer which are formed by the downwardly extending wafer surface in each channel. Thereafter, pressure is applied to all of the ports to press the wafer firmly against the overlying photomask for subsequent exposure.

10 Claims, 11 Drawing Figures

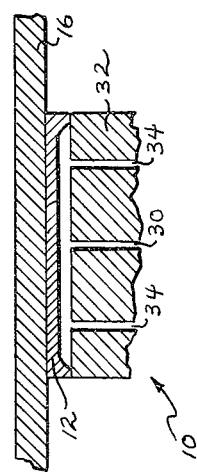
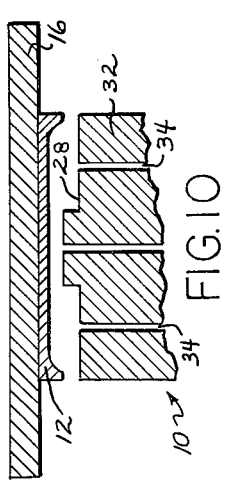
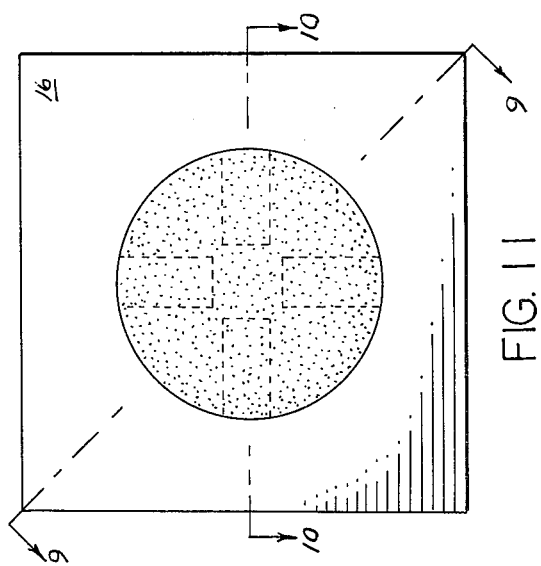
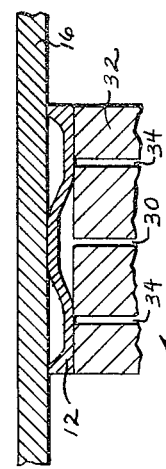
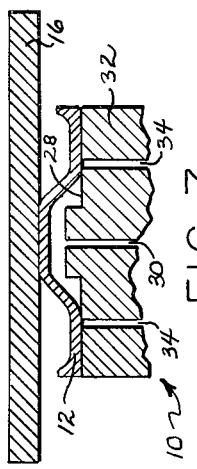
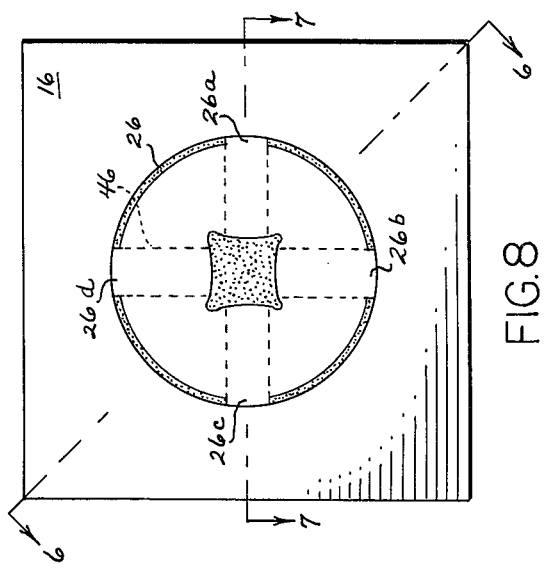
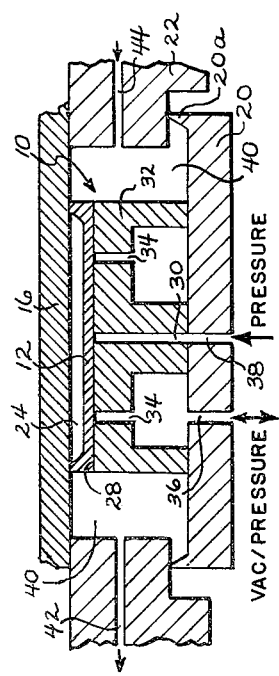
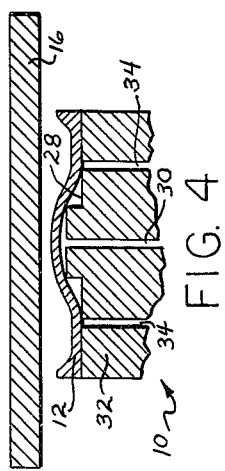
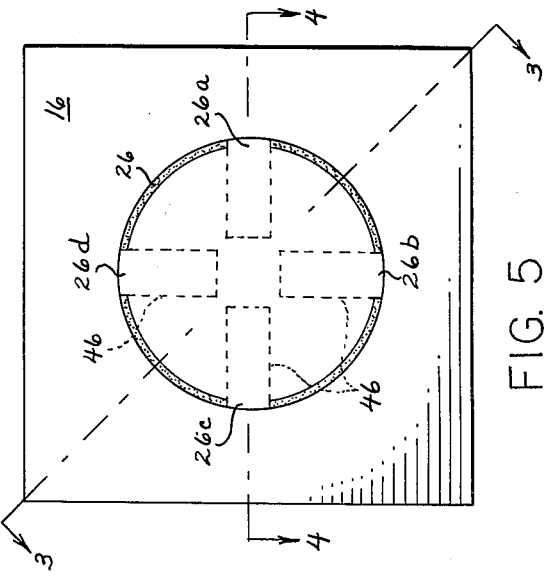

METHOD OF POSITIONING A SEMICONDUCTOR WAFER FOR CONTACT PRINTING

BACKGROUND OF THE INVENTION

The present invention relates to semiconductor wafer chucks in general, and, more particularly, a non-planar semiconductor wafer chuck and method of using the same.

Manual and automatic mask aligment systems are well known in the semiconductor industry. A representive example of an alignment system is the Model CA-400 mask alignment system manufactured by the Cobilt Division of The Computervision Corporation, Sunneyvale, Calif. In mask alignment systems, a semiconductor wafer is either manually or automatically aligned with an overlying photomask for subsequent exposure of the photosensitive wafer surface. The wafer is positioned on a wafer chuck which moves the semiconductor wafer into contact with the photomask. During exposure, the wafer and mask are held in firm contact by a vacuum while a low-pressure nitrogen "pillow" is applied to the back side of the wafer. A nitrogen purge is present in the area over the wafer during the alignment and surrounding the wafer during mask and wafer contact.

Conventional wafer chuck systems normally utilize a leveling device to position the semiconductor wafer in a plane parallel to the plane of the photomask. If all semiconductor wafers were uniformly planar, such a system would provide uniform contact of the wafer against the surface of the photomask. However, in actuality the semiconductor wafers do not have a uniform planar surface. Many wafers have a "dished" configuration so that when the wafers are pressed against the overlying photomask, only the peripheral edge of the wafer contacts the photomask. The peripheral contact pattern of the dished semiconductor wafer provides a circular seal around the wafer which traps a portion of the nitrogen purge within the dished area of the wafer between the wafer and the overlying photomask. When pressure is applied to the back surface of the wafer, the entrapped nitrogen provents a uniform planar contact between the semiconductor wafer and the photomask.

It is accordingly a general object of the present invention to provide an improved wafer chuck and method of using same.

It is a specific object of the present invention to provide a non-planar, semiconductor wafer chuck and method of using the same which produces a uniform, planar contact between a non-planar semiconductor wafer and a photomask.

These objects and other objects are features of the present invention will best be understood from a detailed description of a preferred embodiment thereof selected for purposes of illustration and shown in the accompanying drawings in which:

FIGS. 3 and 4 are diagrammatic views in section of the non-planar wafer chunk of the present invention;

FIG. 5 is a contact plane illustration of the contact between a dished semiconductor wafer and the overlying mask when the non-planar chunk of the present invention is at Step No. 1 of the non-planar chunk operational sequence;

FIGS. 6 and 7 are diagrammatic views in section of the non-planar chunk at Step No. 2 of the operational sequence;

FIG. 8 is a contact plane illustration of the contact between a dished semiconductor wafer and the overlying mask at Step No. 2 in the non-planar chunk operational sequence;

FIGS. 9 and 10 are diagrammatic views in section of the non-planar chunk Step No. 3 in the operational sequence; and, FIG. 11 is a contact plane illustration of a dished semiconductor wafer and the overlying mask at Step No. 3 in the non-planar chunk operational sequence.

Figure 1:
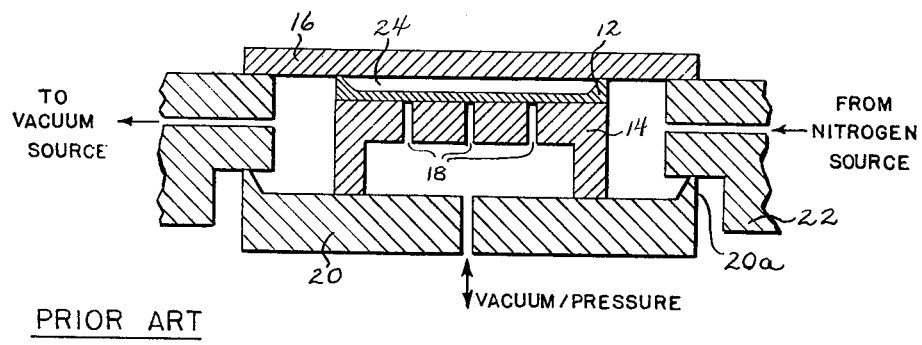
FIG. 1 is a diagrammatic view in section showing a prior art chunk assembly for positioning a semiconductor wafer against a photomask.
Figure 2:
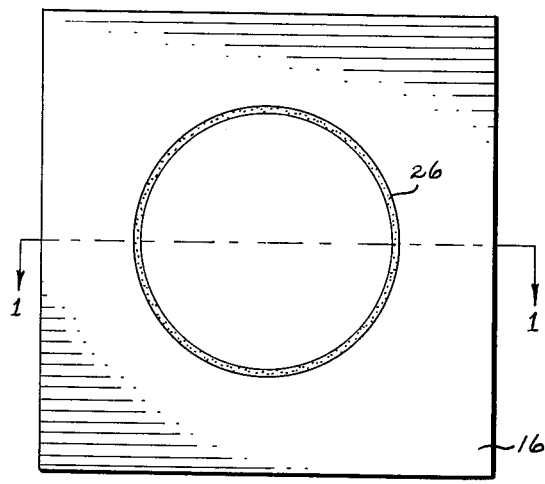
FIG. 2 is a contact plane illustration showing the contact between a dished semiconductor wafer and the overlying mask when the prior art chunk of FIG. 1 is employed.

Turning now to the drawings, FIGS. 1 and 2 illustrate the configuration of a prior art chuck assembly while FIGS. 3 through 11 illustrate the structure and sequential operation of a non-planar chuck constructed in accordance with the present invention and indicated generally by the reference numeral 10. The non-planar chuck 10 is designed to improve the printing quality obtained when reproducing photomask images on semiconductor wafers. The chuck improves the results primarily when the wafer and mask surface configurations produce a trapped film of nitrogen between the two surfaces. This problem is illustrated in FIGS. 1 and 2 of the drawings in which a dished wafer 12 is shown positioned on a conventional wafer chuck 14. In order to emphasize the problem and solution and for purposes of illustration and clarity, the thicknesses of the relevent items shown in cross section in the various drawings have not been depicted to scale.

Looking specifically at FIGS. 1 and 2, the conventional wafer chuck 14 supports a dished wafer 12. The chuck 14 is movable in an up and down direction as viewed in FIG. 1 to bring the wafer 12 into contact with an overlying photomask 16. The chuck 14 has a plurality of vacuum/pressure ports 18 which extend through the chuck and communicate with the front surface thereof. A circular gasket 20 having an upwardly extending sealing portion 20a forms a seal with the supporting structure 22.

The wafer chuck 14 moves in an upwardly direction to bring the wafer 12 into contact with the overlying photomask 16. Normally, nitrogen is present in the area between the wafer and mask during the alignment operation. When the dished wafer is moved into contact with the photomask 16, nitrogen can be trapped in an area 24 between the wafer surface and the photomask because a circular seal 26 is formed by the edge of the dished wafer. This seal is illustrated in the contact plane drawing of FIG. 2. Even if pressure is applied to the back surface of the wafer, the pressure does not significantly reduce the wafer-to-mask separation. Generally speaking, a greater separation produces poorer quality in contact printing with concomitant reduction in the semiconductor yields.

FIGS. 3–11 illustrate the non-planar chuck 10 of the present invention and the method of utilizing the chuck. The non-planar chuck operates principally by breaking the seal at the periphery of the wafer and allowing any trapped nitrogen at the center of the wafer to escape through the breaks in the seal. Although FIGS. 3–11 illustrate the sequence of operation of the non-planar chuck with a dished wafer 3 it should be understood that the chuck can be employed with planar wafers as well as with wafers which have a different form of shape distortion.

Looking now at FIGS. 3–5, the non-planar chuck 10 has a wafer engaging surface 28, a central port or ports 30 which extend through the chuck body 32 and are in fluid communication with the wafer engaging surface 28. A plurality of peripherally located ports 34 also extend through the chuck body 32 and are in fluid communication with the wafer engaging surface 28 of the chuck. A corresponding port 36 is formed in gasket 20 to communicate with the peripherally located ports 34. A centrally located port 38 is provided in gasket 20 to fluidly communicate with the central port or ports 30 in the chuck body.

The sealing edges 20a of the gasket form a pressure seal with the supporting structure 22. The chuck, gasket supporting structure and photomask define a vacuum chamber 40 which is evacuated through vacuum line 42. A nitrogen inlet line 44 is provided to admit nitrogen within the chamber 40 during alignment of the wafer.

It can be seen from an inspection of FIGS. 3–5 that the non-planar chuck 10 has a plurality of outwardly extending channels 46, which in the preferred embodiment are radially extending, (shown by the dashed lines in FIG. 5) which commence at a radial distance from the center of the chuck and extend outwardly to the perimeter thereof. It will be appreciated that while the preferred embodiment of the invention employs a circular chuck in conjunction with a circular wafer, the invention can be used with non-circular chucks and non-circular wafers. Preferably, the channels or groves are 0.0003 inch to 0.0005 inch deep. atmospheric pressure is applied to the central port(s) 30 while a vacuum is applied to the peripheral ports 34 through the corresponding gasket ports 36 and 38. The vacuum causes the wafer to be pulled down into the radially extending channels thereby breaking the circular seal 26 at four locations 26a, 26b, 26c and 26d, as shown in FIG. 5.

Since there is a pressure differential between the top and the bottom of the wafer center, the center tends to rise up against the photomask and, after a delay of about two to three seconds, assumes the position shown in FIGS. 6–8. Most of the nitrogen which normally would have been trapped in area 24 between the wafer and mask has now escaped through the breaks in the circular seal 26. Thereafter, pressure is applied to the back surface of the wafer through the gasket port 36 and the chuck peripheral ports 34. The pressure applied to the back surface of the wafer flattens the wafer against the mask as shown in FIGS. 9–11. A small amount of nitrogen escapes along the radially extending channels into the vacuum chamber 40, but this is insignificant provided the channel depth is not excessive. It should be noted that the depth of the channels should be sufficient to prevent the wafer from sealing against the mask. A balance seems to exist within the channel depth range of 0.0003 to 0.0005 inch deep.

A variety of means can be employed to form the channels on the wafer engaging top surface of the chuck. It has been found that the channels can be conviently fabricated by depositing an electroless nickel film onto an otherwise planar chuck top surface to a depth of 0.3 to 0.5 thousandths. The nickel is then etched away in the areas which are to become the channels using a strong nitric acid solution.

Having described in detail a preferred embodiment of my invention, it will now be apparent to those skilled in the art that numerous modifications can be made therein without departing from the scope of the invention as defined in the appended claims. It will be appreciated by those skilled in the art that non-planar chuck of the present invention produces a deliberate mechanical deformation of the semiconductor wafer to solve the problem of achieving a substantially uniform contact between the photomask and a non-planar wafer with a minimum separation therebetween during wafer exposure.

What I claim and desire to secure by Letters Patent of the United States is:

1. Method of positioning a semiconductor wafer with respect to a photomask for photographically contact printing the wafer, said method comprising in sequence the steps of:
   1. positioning a semiconductor wafer on a wafer chuck;
   2. moving the wafer and chuck into proximity with respect to the photomask with at least a portion of the periphery of the wafer in contact with the photomask;
   3. temporarily, physically deforming the wafer to form at least one radially extending portion therein which intersects the portion of the wafer periphery in contact with the photomask, said radially extending deformed portion being positioned further from the photomask than the central portion of the wafer;
   4. moving the central portion of the wafer into photographic printing contact with the photomask;
   5. terminating said temporary, physical deformation of the wafer; and, thereafter,
   6. moving the remaining portion of the wafer into photographic printing contact with the photomask.

2. The method of claim 1, further characterized by temporarily physically deforming said semiconductor wafer to form a plurality of outwardly extending portions therein each one of which intersects the periphery of the wafer and is positioned further from the photomask than the central portion of the wafer.

3. The method of claim 2 wherein said temporary, physical deformation of the semiconductor wafer is produced by a pressure differential between the front and back surfaces of the wafer at each one of said outwardly extending portions.

4. The method of claim 2 wherein the central portion of the wafer is moved into photographic printing contact with the photomask by producing a pressure differential between the front and back surfaces of the wafer at the central portion thereof.

5. The method of claim 2 wherein said remaining portion of the wafer is moved into photographic printing contact with the photomask by producing a pressure differential between the front and back surfaces of the wafer at said remaining portion thereof.

6. Method of positioning a dished semiconductor wafer with respect to a photomask for photographically contact printing the wafer, said method comprising the steps of:
   1. Positioning a dished semiconductor wafer on a wafer chuck with the concavity of the wafer facing away from the chuck and toward a photomask;
   2. Moving the wafer and chuck into proxmity with respect to the photomask so that the periphery of the dished semiconductor wafer forms a peripheral seal with the photomask;
3. Temporarily, physically deforming the wafer to form at least one outwardly extending portion which is positioned further from the photomask than the central portion of the wafer and which intersects the periphery of the wafer thereby breaking the peripheral seal at the intersection;
4. Moving the central portion of the wafer into photographic printing contact with the photomask;
5. Terminating said temporary, physical deformation of the wafer; and thereafter,
6. Moving the remaining portion of the wafer into photographic printing contact with the photomask.

7. The method of claim 6 further characterized by temporarily physically deforming said dished semiconductor wafer to form a plurality of outwardly extending portions therein each one of which is positioned further from the photomask than the central portion of the wafer and intersects the periphery of the wafer thereby breaking the peripheral seal at the intersection.

8. The method of claim 6 wherein said temporary, physical deformation of the semiconductor wafer is produced by a pressure differential between the front and back surfaces of the wafer at each one of said outwardly extending portions.

9. The method of claim 6 wherein the central portion of the wafer is moved into photographic printing contact with the photomask by producing a pressure differential between the front and back surfaces of the wafer at the central portion thereof.

10. The method of claim 9 wherein said remaining portion of the wafer is moved into photographic printing contact with the photomask by producing a pressure differential between the front and back surfaces of the wafer at said remaing portion thereof.

* * * * *